(12) United States Patent
Dorhout et al.

(10) Patent No.: US 10,734,395 B2
(45) Date of Patent: *Aug. 4, 2020

(54) INTEGRATED ASSEMBLIES AND METHODS OF FORMING INTEGRATED ASSEMBLIES

(71) Applicant: Micron Technology, Inc., Boise, ID (US)

(72) Inventors: Justin B. Dorhout, Boise, ID (US); Kunal R. Parekh, Boise, ID (US); Martin C. Roberts, Boise, ID (US); Mohd Kamran Akhtar, Boise, ID (US); Chet E. Carter, Boise, ID (US); David Daycock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/663,068

(22) Filed: Oct. 24, 2019

(65) Prior Publication Data

US 2020/0058663 A1  Feb. 20, 2020

Related U.S. Application Data

(60) Division of application No. 16/270,526, filed on Feb. 7, 2019, now Pat. No. 10,483,270, which is a
(Continued)

(51) Int. Cl.
*H01L 27/11524* (2017.01)
*H01L 27/11556* (2017.01)
(Continued)

(52) U.S. Cl.
CPC .. *H01L 27/11524* (2013.01); *H01L 27/11551* (2013.01); *H01L 27/11553* (2013.01);
(Continued)

(58) Field of Classification Search
CPC ......... H01L 27/11524; H01L 27/11582; H01L 27/11553; H01L 27/11551; H01L 27/11556; H01L 27/1157
See application file for complete search history.

(56) References Cited

U.S. PATENT DOCUMENTS 4,116,720 A * 9/1978 Vinson .............. H01L 27/10823
                                                            438/239
9,356,043 B1  5/2016 Sakakibara et al.
(Continued)

*Primary Examiner* — Galina G Yushina
(74) *Attorney, Agent, or Firm* — Wells St. John P.S.

(57) ABSTRACT

Some embodiments include an integrated assembly with a semiconductor channel material having a boundary region where a more-heavily-doped region interfaces with a less-heavily-doped region. The more-heavily-doped region and the less-heavily-doped region have the same majority carriers. The integrated assembly includes a gating structure adjacent the semiconductor channel material and having a gating region and an interconnecting region of a common and continuous material. The gating region has a length extending along a segment of the more-heavily-doped region, a segment of the less-heavily-doped region, and the boundary region. The interconnecting region extends laterally outward from the gating region on a side opposite the semiconductor channel region, and is narrower than the length of the gating region. Some embodiments include methods of forming integrated assemblies.

11 Claims, 17 Drawing Sheets

Related U.S. Application Data continuation of application No. 15/818,338, filed on Nov. 20, 2017, now Pat. No. 10,229,923, which is a division of application No. 14/949,807, filed on Nov. 23, 2015, now Pat. No. 9,853,037.

(51) Int. Cl.
*H01L 27/11582* (2017.01)
*H01L 27/1157* (2017.01)
*H01L 27/11551* (2017.01)
*H01L 27/11553* (2017.01)

(52) U.S. Cl.
CPC .. *H01L 27/11556* (2013.01); *H01L 27/11582* (2013.01); *H01L 27/1157* (2013.01)

(56) References Cited

U.S. PATENT DOCUMENTS

| | | |
|---|---|---|
| 2008/0179659 A1 | 7/2008 | Enda et al. |
| 2008/0242028 A1 | 10/2008 | Mokhlesi et al. |
| 2009/0230454 A1* | 9/2009 | Pekny ............... H01L 27/11565 257/319 |
| 2009/0294824 A1 | 12/2009 | Gomikawa et al. |
| 2010/0120214 A1 | 5/2010 | Park et al. |
| 2011/0076819 A1* | 3/2011 | Kim .................. H01L 27/11551 438/279 |
| 2011/0159645 A1 | 6/2011 | Pekny |
| 2012/0211823 A1 | 8/2012 | Lim et al. |
| 2013/0069137 A1 | 3/2013 | Pekny |
| 2013/0248971 A1 | 9/2013 | Miyazaki et al. |
| 2013/0248974 A1* | 9/2013 | Alsmeier ............... G11C 16/04 257/321 |
| 2014/0227842 A1* | 8/2014 | Lee .................. H01L 29/66833 438/268 |
| 2015/0179660 A1 | 6/2015 | Yada et al. |
| 2015/0279855 A1 | 10/2015 | Lu et al. |
| 2015/0294978 A1* | 10/2015 | Lu ....................... H01L 27/1157 438/269 |
| 2016/0247570 A1 | 8/2016 | Chang et al. |
| 2016/0260716 A1 | 9/2016 | Lee |

\* cited by examiner

US 10,734,395 B2

INTEGRATED ASSEMBLIES AND METHODS OF FORMING INTEGRATED ASSEMBLIES

RELATED PATENT DATA

This patent resulted from a divisional of U.S. patent application Ser. No. 16/270,526 filed Feb. 7, 2019, which is a continuation of U.S. patent application Ser. No. 15/818,338 which was filed Nov. 20, 2017, which resulted from a divisional of U.S. patent application Ser. No. 14/949,807 which was filed Nov. 23, 2015, each of which is hereby incorporated by reference.

TECHNICAL FIELD

Integrated assemblies and methods of forming integrated assemblies.

BACKGROUND

Memory provides data storage for electronic systems. Flash memory is one type of memory, and has numerous uses in modern computers and devices. For instance, modern personal computers may have basic input/output system (BIOS) stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NOT-AND (NAND) may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells.

The vertically-stacked memory cells may be block-erased by generating hole carriers beneath them, and then utilizing an electric field to sweep the hole carriers upwardly along the memory cells.

A gating structure of a transistor may be utilized to provide gate-induced drain leakage (GIDL) which generates the holes utilized for block-erase of the memory cells. The transistor may be a select device, such as a source-side select (SGS) device. Difficulties are encountered in utilizing conventional gating structures as select devices. Accordingly, it would be desirable to develop new gating structures, and new methods of forming gating structures.

Gating structures may be utilized in other devices besides select devices, and it would be desirable for new gating structure architectures to be suitable for utilization in other devices besides select devices.

DETAILED DESCRIPTION OF THE ILLUSTRATED EMBODIMENTS

Some embodiments include new gating structures having a gating region and an interconnecting region of a common and continuous material. The gating structures may be provided adjacent semiconductor channel material. The semiconductor channel material may comprise a boundary region where a more-heavily-doped region interfaces with a less-heavily-doped region, and the gating region of the gating structure may have a length which extends along a segment of the more-heavily-doped region, a segment of the less-heavily-doped region, and the boundary region. The gating structures may be suitable for utilization in select device transistors, such as transistors configured to generate GIDL-induced holes for block erase of memory cells. The gating structures may also be suitable for other applications. Example embodiments are described below with reference to FIGS. 1-17.

Figure 1:
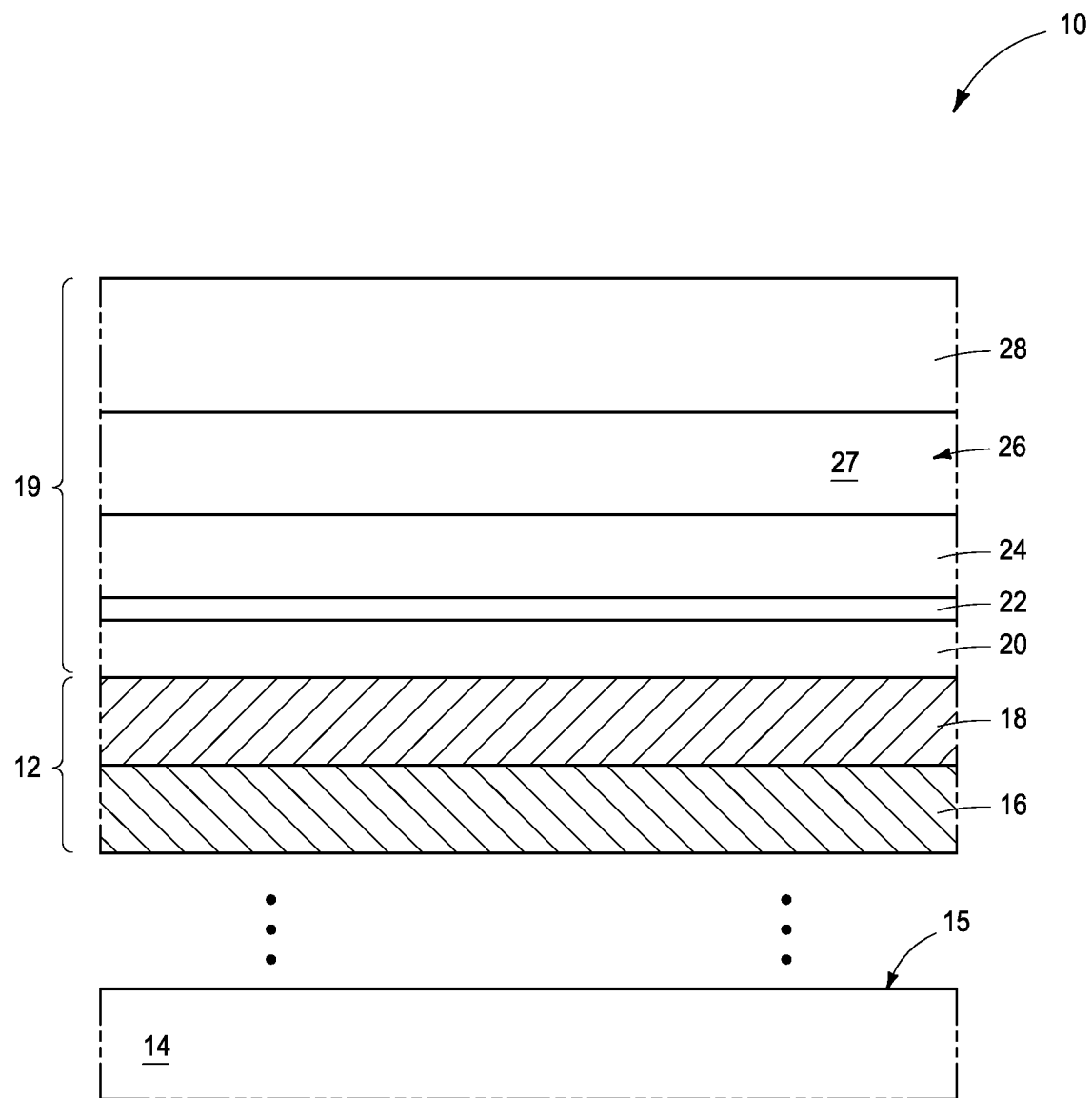
FIGS. 1-13 are diagrammatic cross-sectional views of an assembly at various process stages of an example method for forming an example embodiment gated structure.

Referring to FIG. 1, an assembly (i.e., construction) 10 comprises a conductive structure 12 over a base 14.

The base 14 may comprise semiconductor material; and may, for example, comprise, consist essentially of, or consist of monocrystalline silicon. The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 14 may correspond to a semiconductor substrate containing one or more materials associated with integrated circuit fabrication. Such materials may include, for example, one or more of refractory metal materials, barrier materials, diffusion materials, insulator materials, etc.

The base 14 has an upper surface 15 which extends horizontally in the cross-sectional view of FIG. 1.

A gap is shown between base 14 and conductive structure 12 to indicate that there may be additional materials between the base 14 and the structure 12 in some embodiments.

The illustrated conductive structure 12 comprises an upper material 18 over a lower material 16. In some embodiments, the lower material 16 may comprise metal and/or metal-containing material; such as, for example, tungsten silicide. In some embodiments the upper material 18 may comprise conductively-doped semiconductor material; such as, for example, conductively-doped silicon. Although the illustrated conductive structure comprises two materials, in other embodiments the conductive structure may comprise only a single material, and in yet other embodiments the conductive structure may comprise more than two materials.

The conductive structure 12 may be configured as a line in some embodiments, and may, for example, correspond to a source line configured for utilization in a three-dimensional NAND memory array.

A stack 19 is formed over the heavily-doped semiconductor material 18. The stack 19 includes a first tier 20, a second tier 22, a third tier 24, a first level 26 of replaceable material 27, and a fourth tier 28. In some embodiments, the first tier 20, third tier 24, and fourth tier 28 may comprise a same composition as one another; such as, for example, silicon dioxide. The second tier 22 may comprise an etch stop material. In some embodiments the second tier 22 may comprise high-k material such as, for example, hafnium oxide, zirconium oxide, aluminum oxide, etc.; with the term high-k meaning a dielectric constant greater than that of silicon dioxide. The replaceable material 27 may be electrically insulative material; and in some embodiments may comprise, consist essentially of, or consist of silicon nitride.

Figure 2:
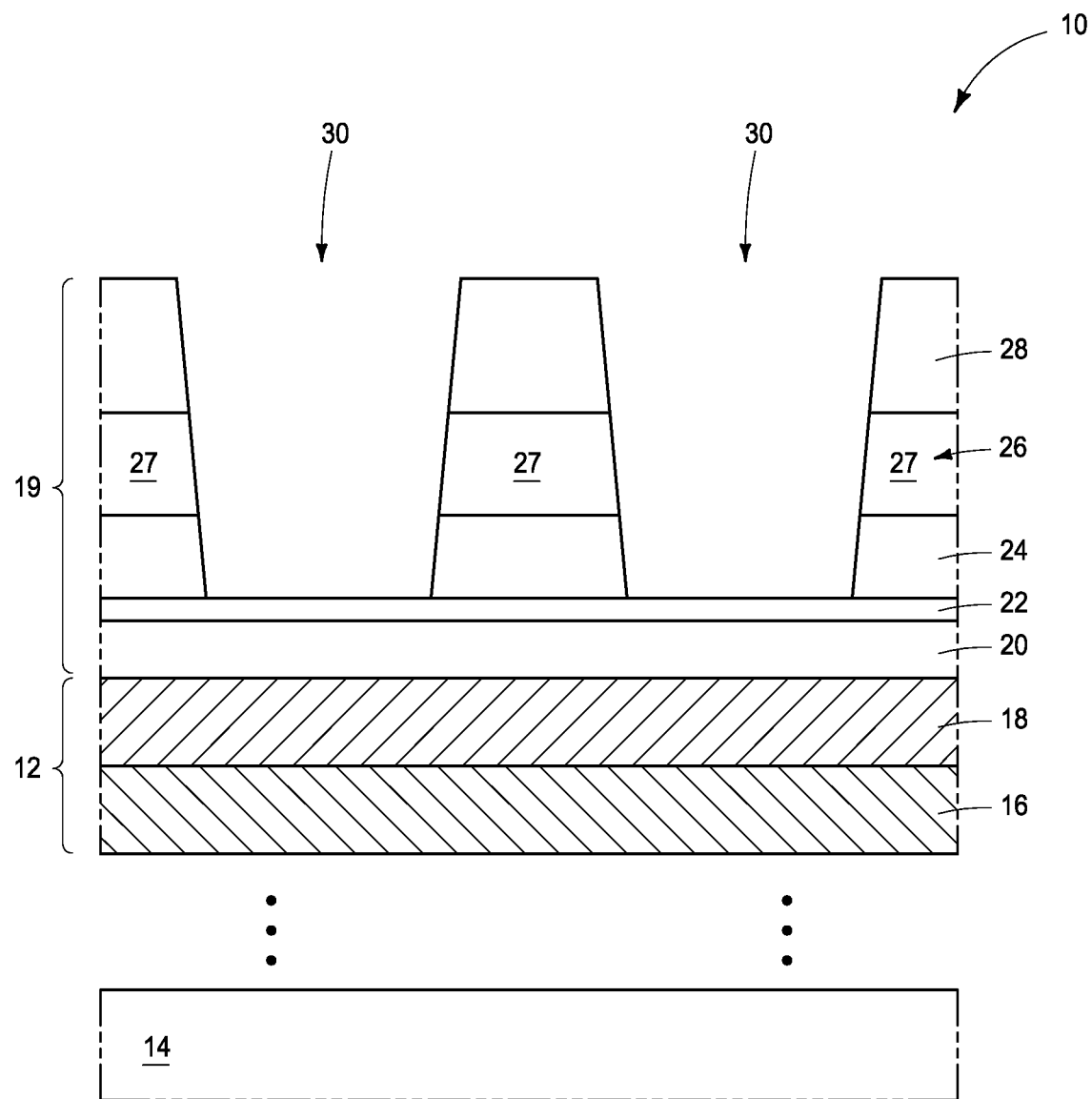

Referring to FIG. 2, openings 30 are formed to extend through upper materials of stack 19 (specifically, through the materials of tiers 24 and 28, and through the replaceable material 27) to the etch stop material of the second tier 22. The illustrated openings have tapered sidewalls, but in other embodiments the sidewalls may be non-tapered.

The utilization of etch stop material of tier 22 may enable all of openings 30 to be uniformly formed to a same depth as one another.

Figure 3:
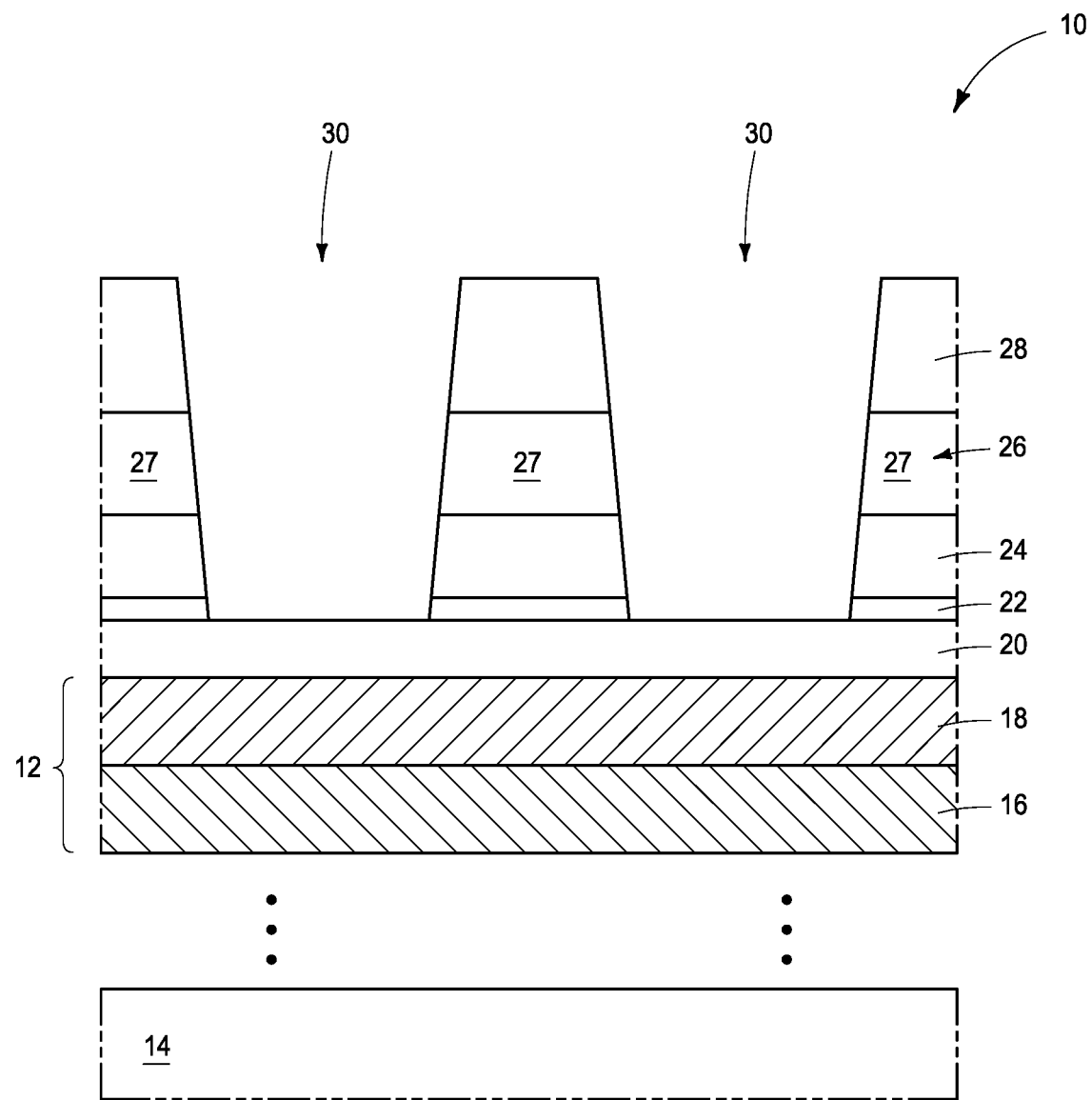

Referring to FIG. 3, the openings 30 are extended through the etch stop material of tier 22 to expose material of the first tier 20.

Figure 3A:
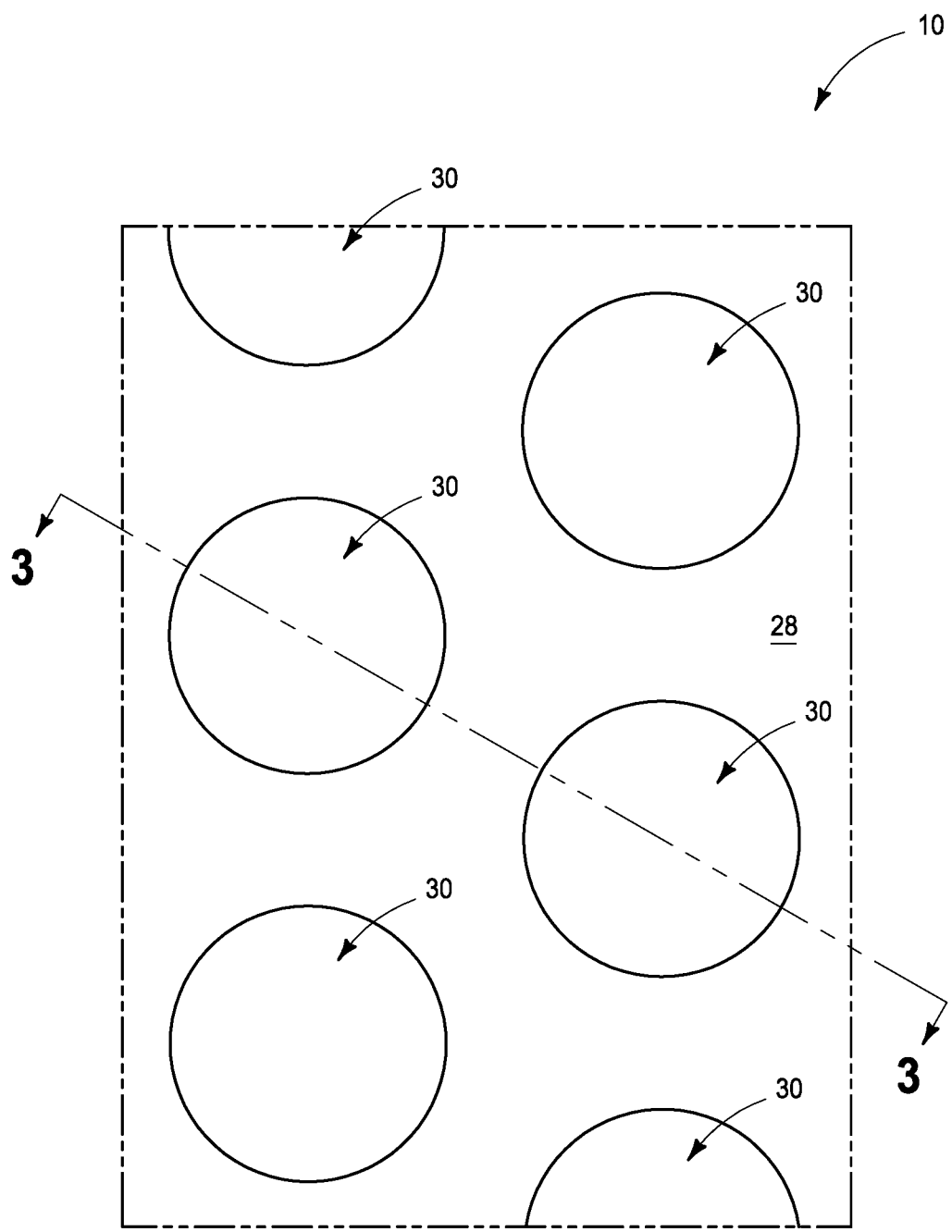
FIG. 3A is a top view of the construction of FIG. 3; with the cross-sectional view of FIG. 3 being along the line 3-3 of FIG. 3A.

The openings 30 may have any suitable shape when viewed from above. For instance, FIG. 3A shows a top view of an example embodiment in which the openings 30 are circular when viewed from above. In other embodiments, the openings may have other shapes when viewed from above; and may, for example, be elliptical, polygonal, square, rectangular, etc.

Figure 4:
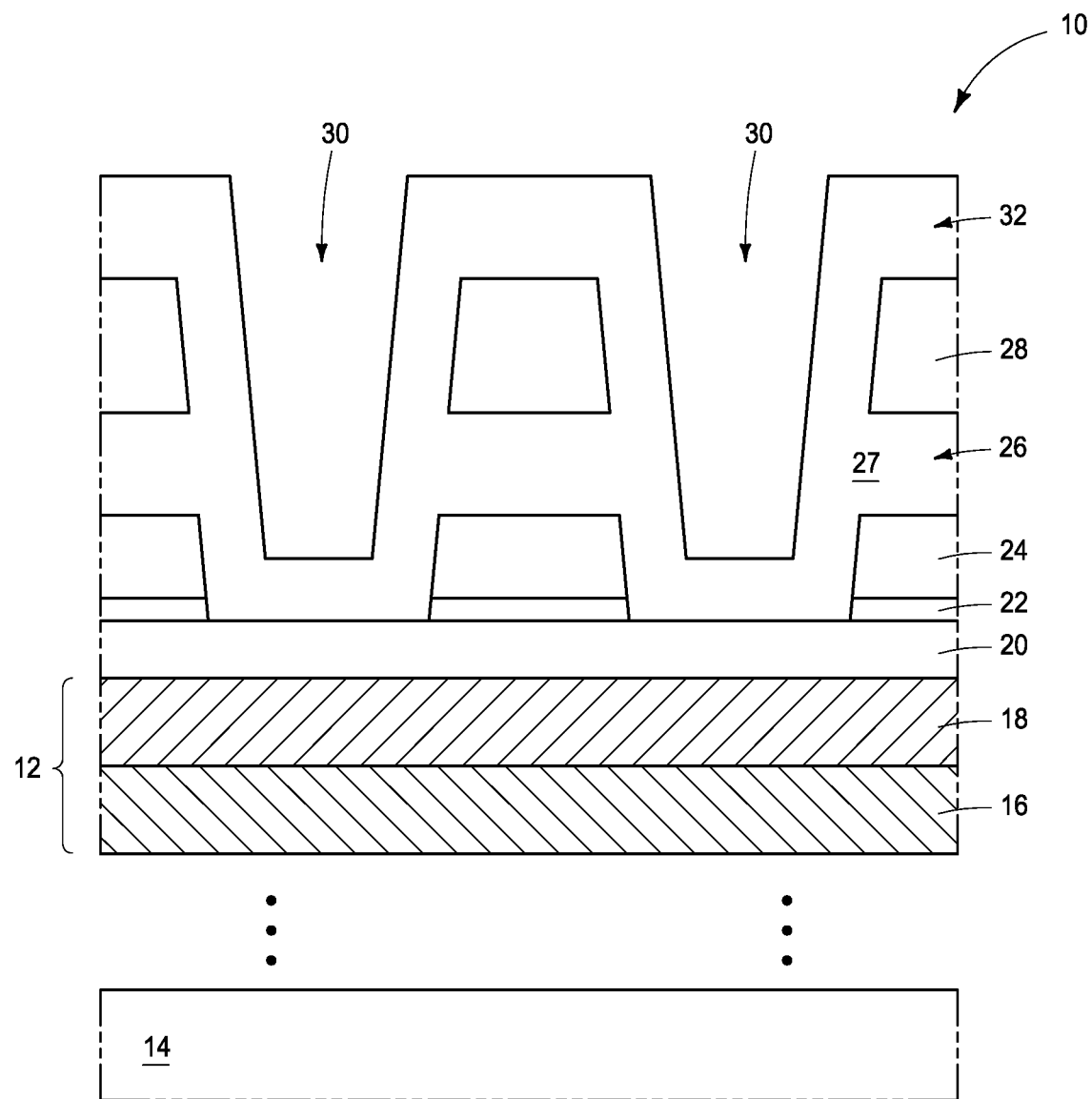

Referring to FIG. 4, a second level 32 of replaceable material 27 is formed to extend within openings 30. The replaceable material 27 of second level 32 lines sidewalls and bottoms of openings 30. In the shown embodiment, the replaceable material of second level 32 is a same material as the replaceable material of first level 26. Accordingly, the first and second levels 26 and 32 merge together. In some embodiments, the replaceable material 27 of levels 26 and 32 may comprise, consist essentially of, or consist of silicon nitride.

Figure 5:
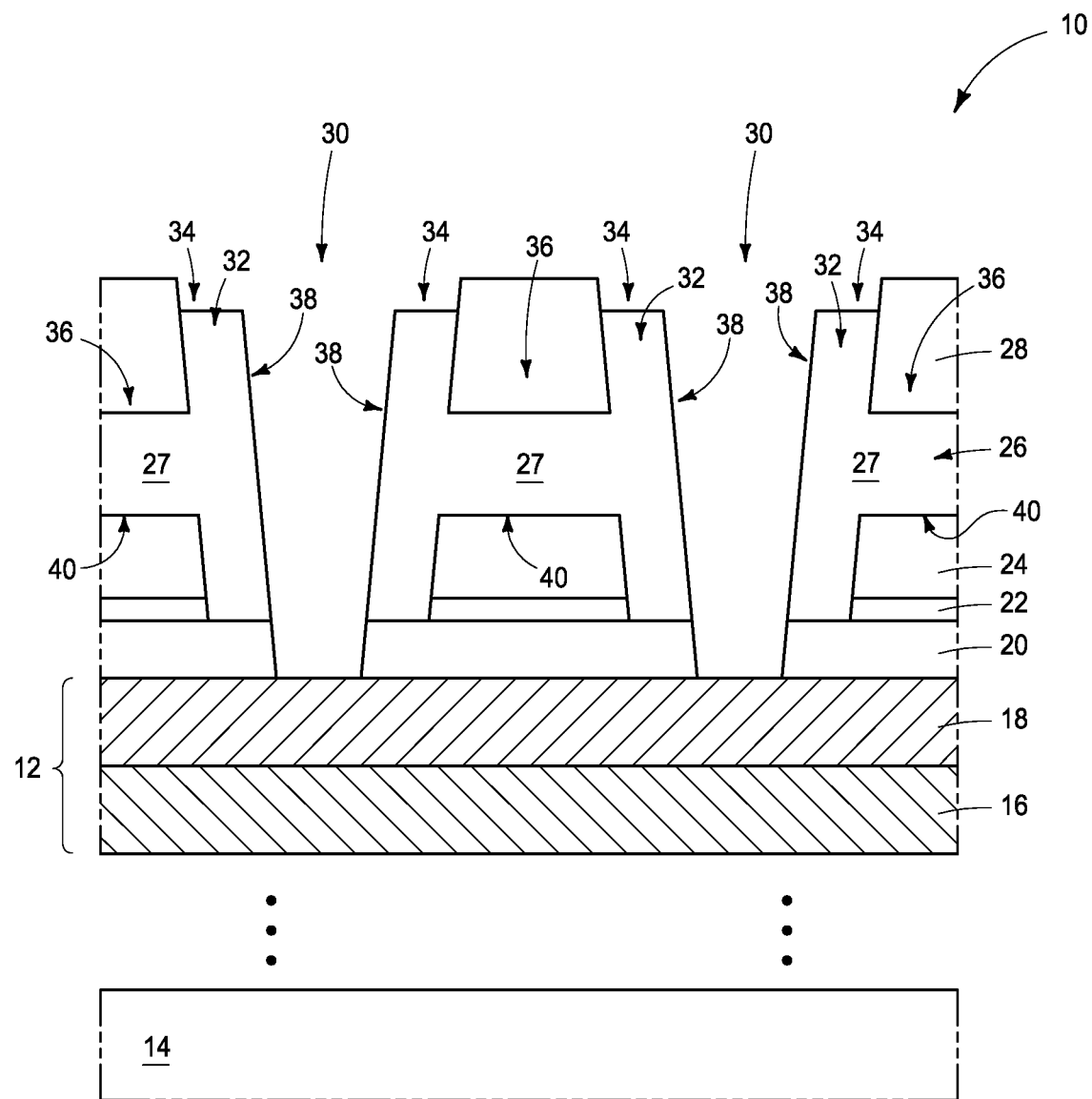

Referring to FIG. 5, the replaceable material 27 of the second level 32 is anisotropically etched to form spacers 34 along sidewalls of openings 30, and to expose bottom surfaces of the openings along the first tier 20. Subsequently, exposed material of the first tier is removed to extend the openings to the heavily-doped semiconductor material 18.

The replaceable material 27 within spacers 34 and first level 26 is configured as replaceable material structures 36. The replaceable material structures have vertical trunk regions 38 (corresponding to the spacers 34), and stem regions 40 extending horizontally outward from the vertical trunk regions. In the illustrated embodiment, the vertical trunk regions are slanted from being absolutely vertical due to the tapered sidewalls of openings 30. In other embodiments, the sidewalls of the openings may be less tapered, and the vertical trunk regions may be less slanted, or even absolutely vertical (to within reasonable tolerances of fabrication and measurement). Similarly, the horizontal stem regions 40 may be slanted in some embodiments, and may be absolutely horizontal (to within reasonable tolerances of fabrication and measurement) in some embodiments.

The second level 32 may be formed to be less than or equal to a thickness of the first level 26 in some embodiments. In later processing, replaceable material of levels 26 and 32 is replaced with conductive material (such replacement is described with reference to FIG. 13). The conductive material may flow along the horizontal stem regions 40 and into the vertical trunk regions 38. If the trunk regions are too thick as compared to the stem regions, there may be inconsistent replacement of material in the trunk regions with the conductive material which may lead to inconsistent performance across a plurality of devices. Accordingly, it may be desired to keep the thickness of the trunk regions 38 less than or equal to the thickness of the stem regions 40 in order to achieve desired uniform filling of the trunk regions during the flow of conductive material into such trunk regions.

Although there appear to be two separate spacers 34 along opposing sidewalls of each of the openings 30 in the cross-sectional view of FIG. 5, in actuality such spacers may be part of an annulus that extends entirely around the closed shape of the opening when viewed from above (with example closed shapes of the openings being shown in the top view of FIG. 3A).

The exposed surfaces of trunk regions 38 may comprise silicon nitride. In some embodiments, such exposed surfaces may be oxidized utilizing exposure to steam or other suitable oxidant.

Figure 6:
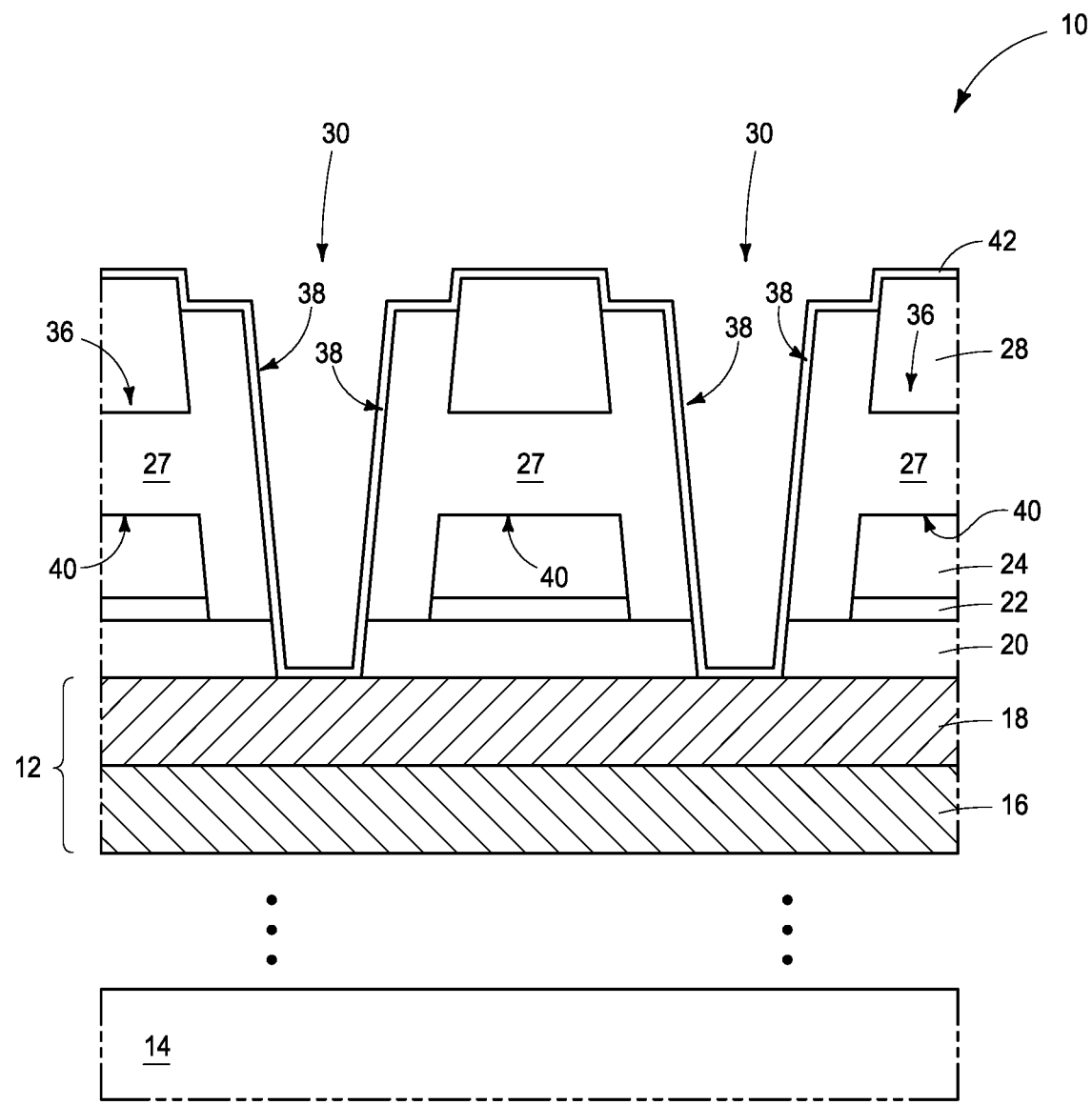

Referring to FIG. 6, gate dielectric 42 is formed to extend into openings 30. The gate dielectric extends across material of tier 28 between the openings, extends along the bottoms of the openings, and extends along sidewalls of the openings. The gate dielectric material may comprise any suitable composition or combination of compositions; and in some embodiments may comprise, consist essentially of, or consist of one or more of silicon dioxide, hafnium oxide, hafnium silicate, zirconium oxide, zirconium silicate, aluminum oxide, etc.

Figure 7:
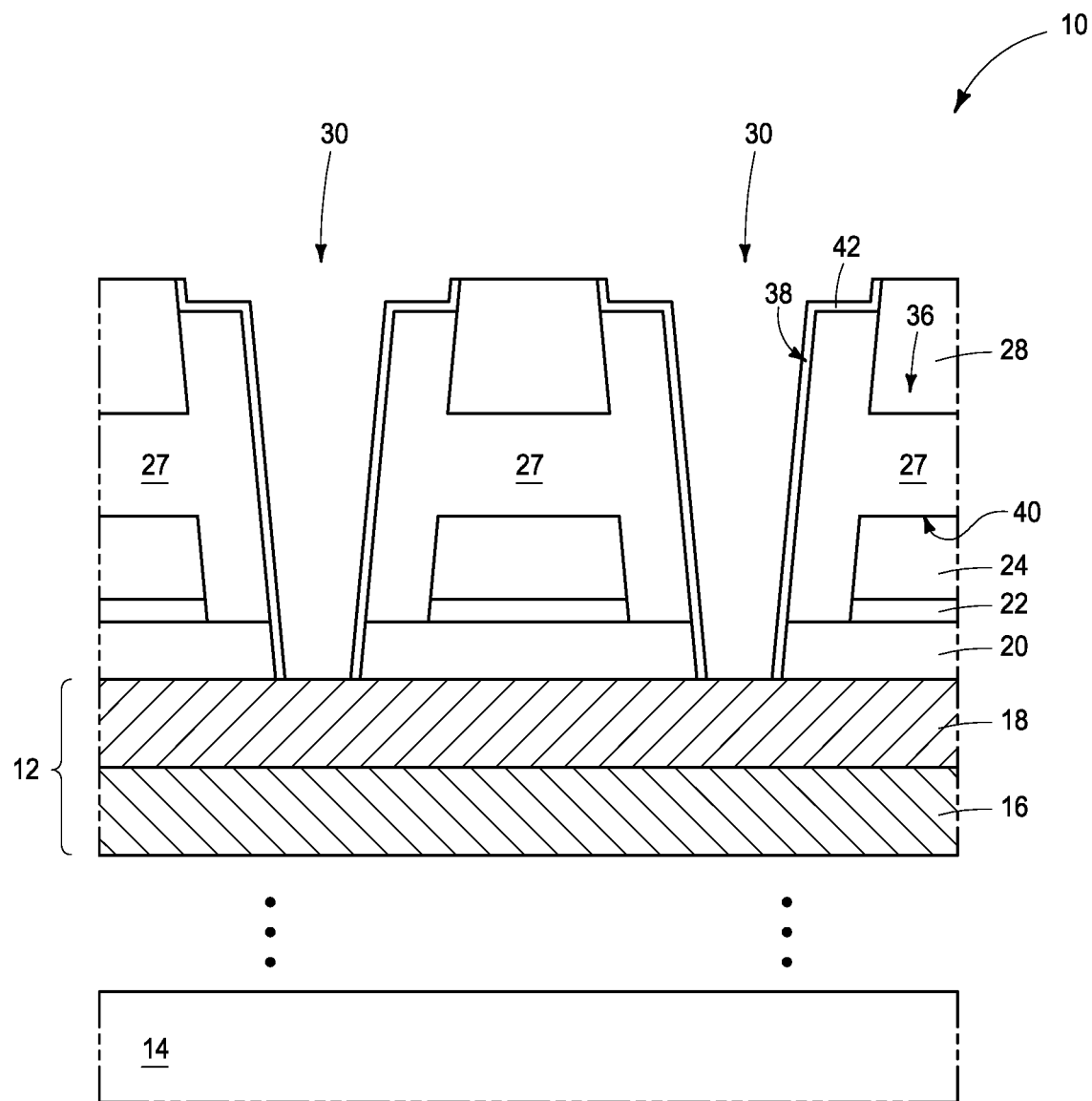

Referring to FIG. 7, gate dielectric 42 is removed from over upper surfaces of tier 28, and from the bottoms of openings 30.

Figure 8:
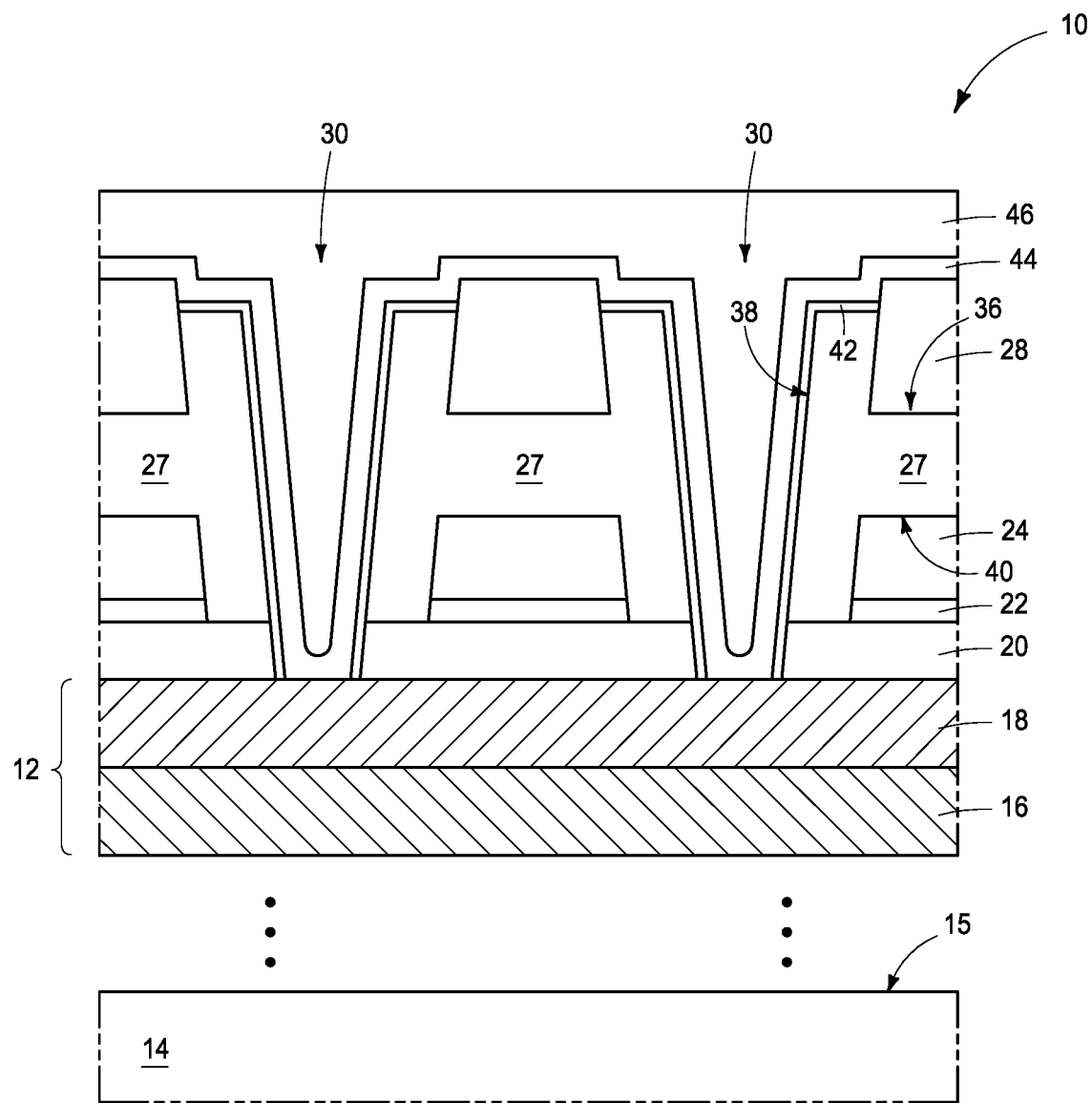

Referring to FIG. 8, semiconductor channel material 44 is formed adjacent gate dielectric 42 within openings 30, and fill material 46 is formed to fill the openings. The channel material along trunk regions 38 extends substantially vertically; or, in other words, extends substantially orthogonally relative to the horizontal surface 15 of base 14.

The semiconductor channel material 44 may comprise any suitable composition; and in some embodiments may comprise lightly-doped silicon. In some embodiments, the terms "heavily-doped" and "lightly-doped" are utilized in relation to one another rather than relative to specific conventional meanings. Accordingly, a "heavily-doped" region is more heavily doped than an adjacent "lightly-doped" region, and may or may not comprise heavy doping in a conventional sense. Similarly, the "lightly-doped" region is less heavily doped than the adjacent "heavily-doped" region, and may or may not comprise light doping in a conventional sense. In some embodiments, the term "lightly-doped" refers to semiconductor material having less than or equal to about $10^{18}$ atoms/cm3 of dopant, and the term "heavily-doped" refers to semiconductor material having greater than or equal to about $10^{19}$ atoms/cm3 of dopant. The semiconductor channel material 44 and heavily-doped semiconductor material 18 may be majority doped to have the same majority carriers (i.e., both may be p-type majority doped in some example embodiments, and both may be n-type majority doped in other example embodiments).

The fill material 46 may comprise any suitable composition or combination of compositions; and in some embodiments may comprise, consist essentially of, or consist of silicon dioxide. The fill material may be formed as a spin-on dielectric which is subsequently densified.

Figure 9:
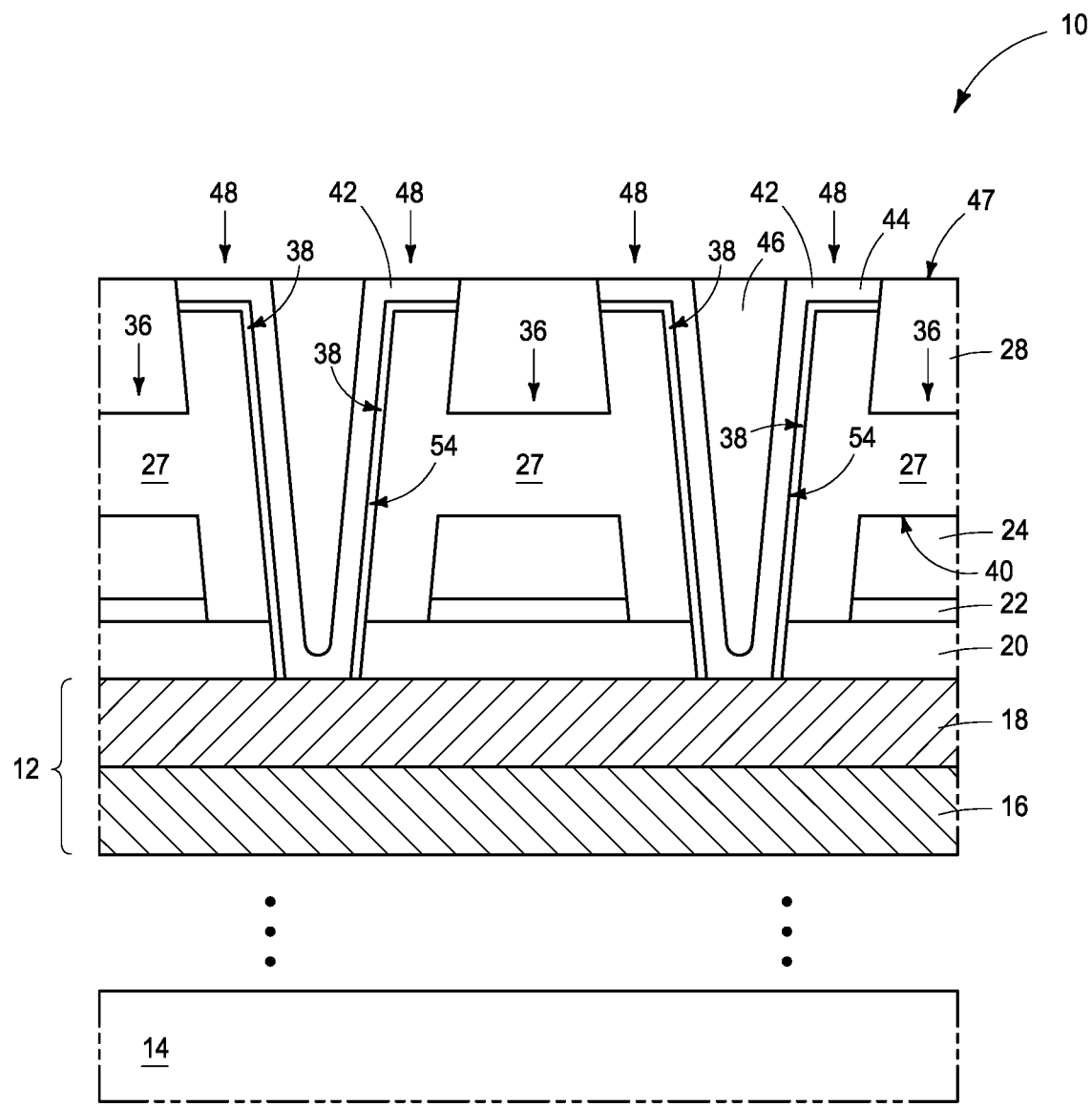

Referring to FIG. 9, assembly 10 is subjected to planarization (for instance, chemical-mechanical planarization) to form a planarized upper surface 47. The planarized upper surface extends across material of tier 28, the semiconductor channel material 44, and the fill material 46.

The semiconductor channel material 44 forms upwardly-opening containers 54 at the processing stage of FIG. 9, with such containers having ridges 48 which extend over upper surfaces of the substantially vertical trunk regions 38 of replaceable material structures 36.

Figure 10:
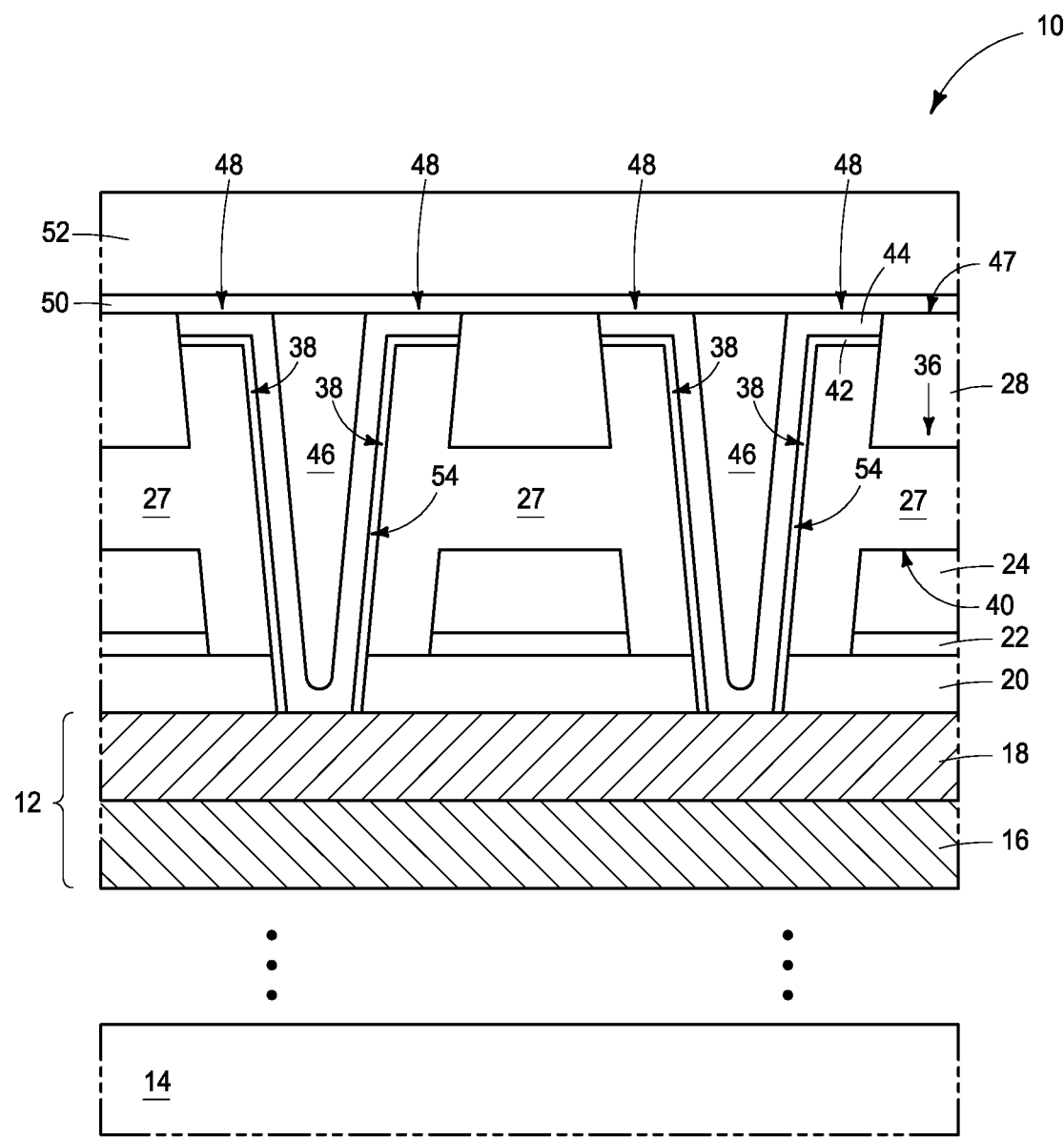

Referring to FIG. 10, materials 50 and 52 are formed over planarized surface 47. In some embodiments, material 50 may correspond to an etch stop material, such as, for example, a high-k material (e.g., hafnium oxide, etc.); and material 52 may correspond to silicon dioxide.

Figure 11:
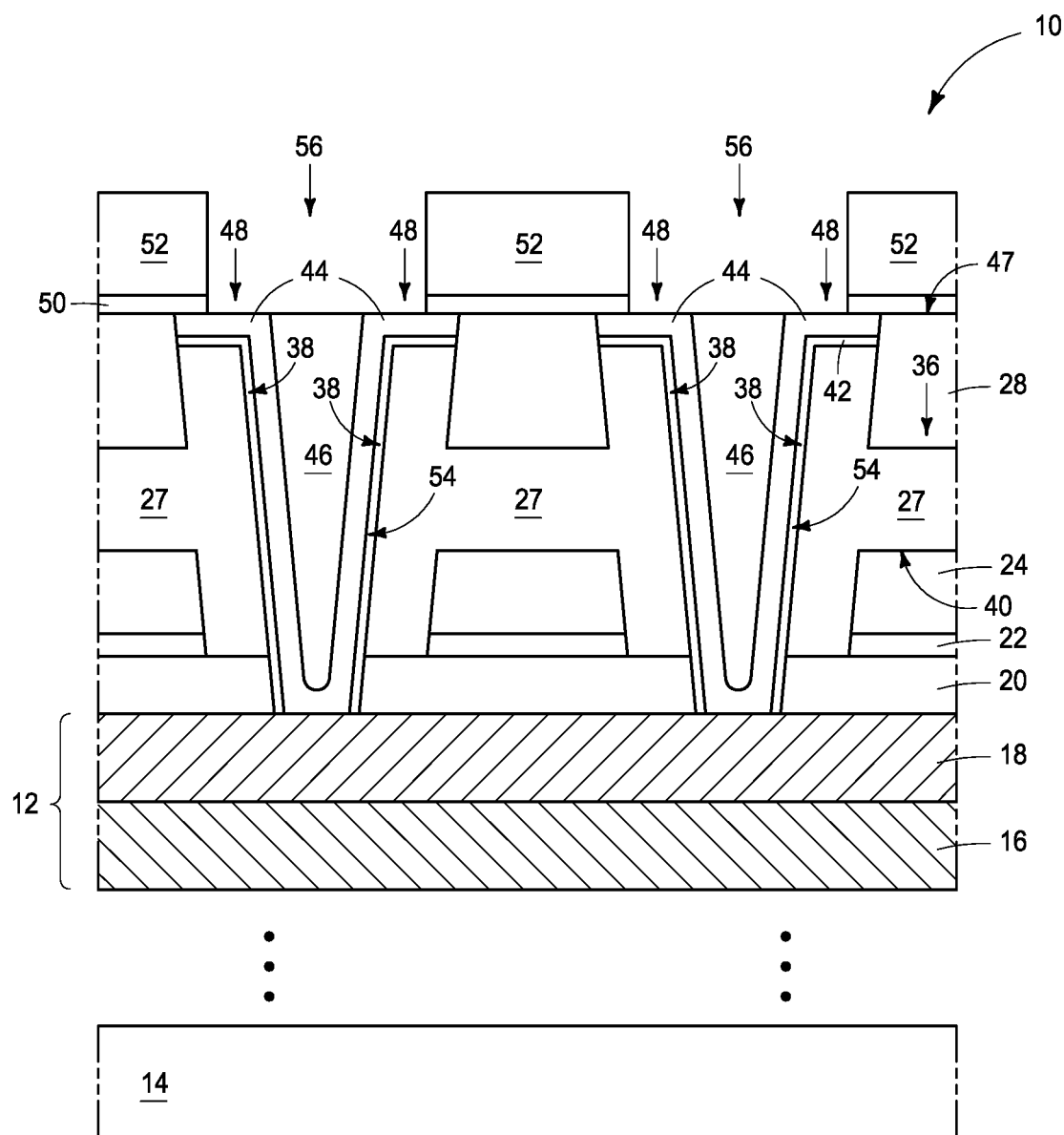

Referring to FIG. 11, openings 56 are formed to extend through materials 50 and 52. Upper surfaces of the ridges 48 of the upwardly-opening containers 54 of semiconductor channel material 44 are exposed at bottoms of the openings 56.

Figure 12:
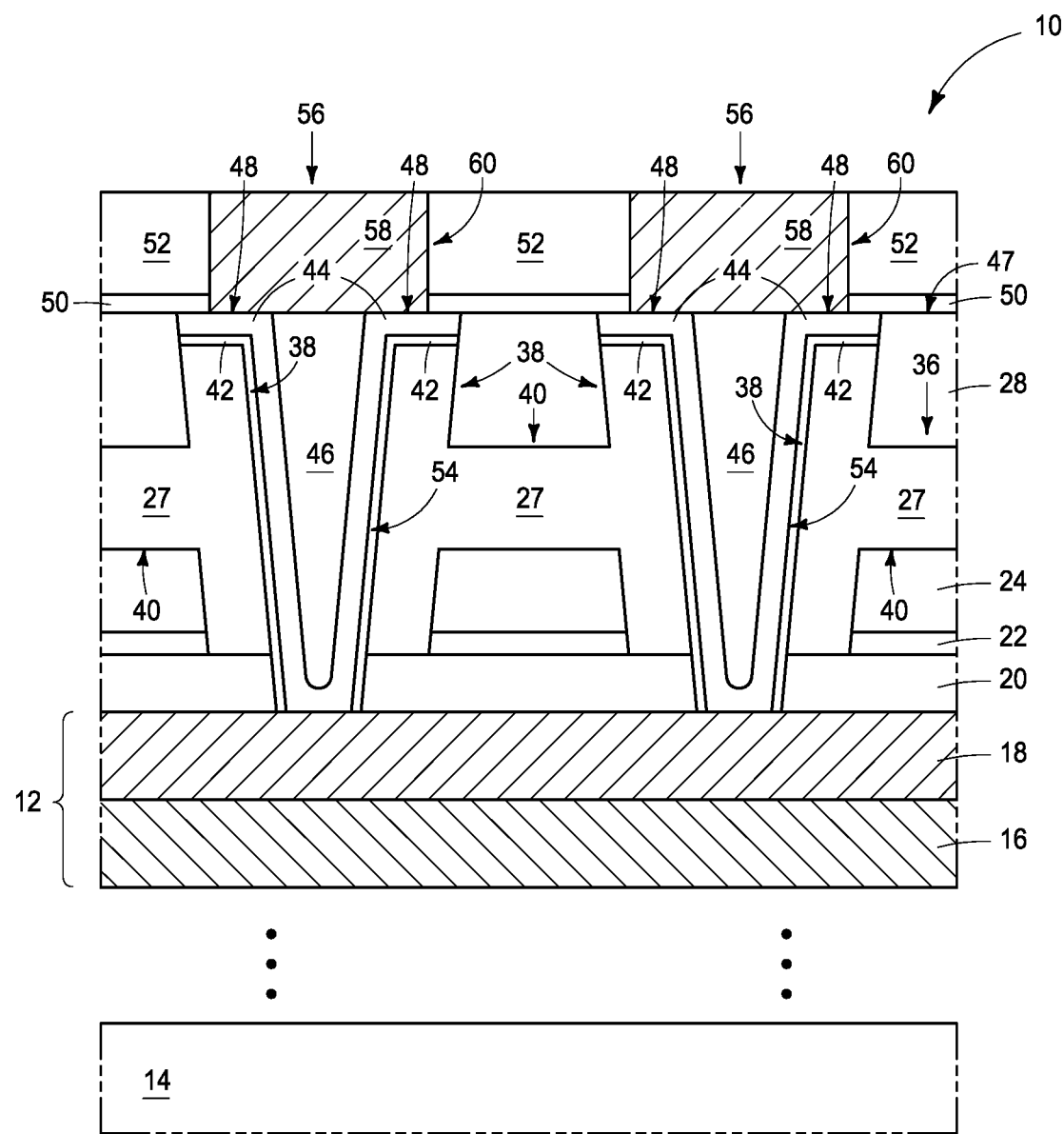

Referring to FIG. 12, conductive material 58 is provided within openings 56 to form conductive plugs 60. The conductive material 58 may comprise any suitable composition or combination of compositions. In some embodiments, the conductive material may comprise one or more of various metals (e.g., tungsten, titanium, etc.), metal-containing compositions (e.g., metal silicide, metal carbide, etc.), and/or conductively-doped second material (e.g., conductively-doped silicon, conductively-doped germanium, etc.).

The conductive material 58 may be formed into the illustrated plugs 60 with any suitable processing. For instance, the conductive material may be formed across an upper surface of material 52, and within openings 56; and then subjected to planarization to remove the conductive material 58 from over material 52 and form the plugs (terminals) 60 within openings 56.

The conductive plugs 60 are over and adjacent the ridges 48 of semiconductor channel material 44.

Figure 13:
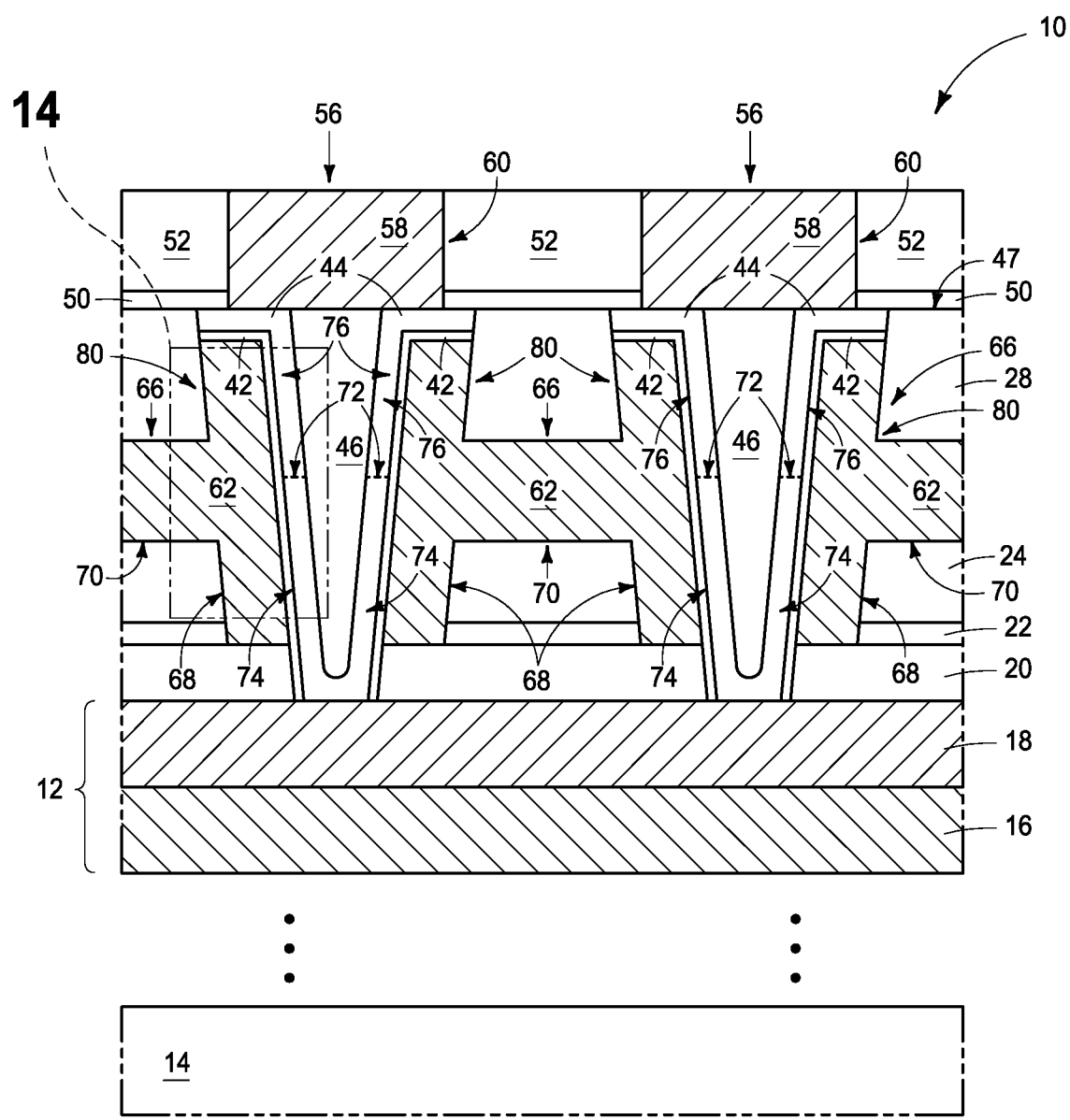

Referring to FIG. 13, the replaceable material 27 (FIG. 12) is replaced with conductive material 62. Such conductive material may comprise any suitable composition or combination of compositions. For instance, in some embodiments conductive material 62 may comprise one or more metals (e.g., tantalum, tungsten, etc.). The replacement of replaceable material 27 with conductive material 62 may occur at any suitable processing stage, and in some embodiments may occur at a processing stage other than the illustrated stage of FIG. 13. For instance, the replacement may occur earlier than the illustrated processing stage in some embodiments. In other embodiments, the replacement may occur later than the illustrated processing stage.

The replacement of material 27 with conductive material 62 may comprise any suitable processing. For instance, material 27 may be removed with one or more suitable etches to leave voids in place of the horizontal stem regions 40 and substantially vertical trunk regions 38 of the replaceable material structures 36 (FIG. 12). Subsequently, conductive material 62 may be formed within the voids to create gating structures 66 in place of the replaceable material structures 36 (FIG. 12). The gating structures 66 comprise substantially vertical gating regions 68 in place of the substantially vertical trunk regions 38 (FIG. 12), and comprise horizontal interconnecting regions 70 in place of the horizontal stem regions 40 (FIG. 12). In some embodiments, an interconnecting region 70 may be considered to extend laterally from a side of a gating region 68 which is opposite to a side adjacent channel material 44.

The conductive material 62 may be flowed along the horizontal interconnecting regions 70, and then into the vertical gating regions 68. As discussed previously, it may be advantageous that the vertical gating regions have thicknesses less than or equal to the thicknesses of the horizontal interconnecting regions so that the gating regions become completely filled with conductive material 62 prior to the interconnecting regions becoming filled and pinching off further flow into the gating regions. The conductive material 62 is a common and continuous material extending throughout the gating regions 68 and interconnecting regions 70.

In some embodiments, the assembly 10 of FIG. 13 may be considered to comprise the gating structures 66 extending within a stack of alternating first and second insulating materials (with tiers 20 and 24 being first insulating material, and tier 22 being second insulating material). Bottom surfaces of the gating regions 68 are along the lower tiers 20 of the first insulative material, bottom surfaces of the interconnecting regions 70 are along the higher tiers 24 of the first insulative material, and intermediate tiers 22 of the second insulative material are between the lower and higher tiers of the first insulative material and are adjacent sides of the gating regions 68.

FIG. 13 shows boundary regions 72 (diagrammatically illustrated with dashed-lines) within the semiconductor channel material 44. Such boundary regions result from out-diffusing dopant from the heavily-doped semiconductor material 18 into lower regions of the semiconductor channel material 44. The out-diffusing forms heavily-doped bottom regions 74 of the semiconductor channel material 44 while leaving less-heavily-doped upper regions 76 of the semiconductor channel material 44. The boundary regions 72 are where the heavily-doped bottom regions interface with the less-heavily-doped upper regions (e.g., may correspond to p+/p− junctions, p+/p junctions, p/p− junctions, n+/n− junctions, n+/n junctions, n/n− junctions, etc.). Although the out-diffusion of dopant from heavily-doped semiconductor material 18 into the bottom regions of channel material 44 is described with reference to FIG. 13, such out-diffusion may occur at any suitable processing stage after formation of the channel material 44 (i.e., the processing stage of FIG. 8), and may occur at a single processing stage, or may occur as a sum of out-diffusions across multiple processing stages. The out-diffusion may be induced with, for example, thermal processing.

Figure 14:
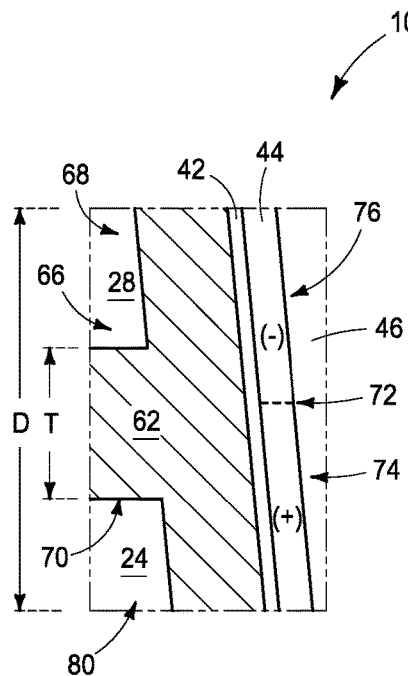
FIG. 14 is an enlarged view of a region of the example embodiment gated structure of FIG. 13.

FIG. 14 shows an expanded view of a region of FIG. 13, and shows a boundary region 72 between a heavily-doped region 74 of channel material 44, and a lightly-doped region 76 of the channel material 44. The symbol "(+)" is utilized in the heavily-doped region 74 and the symbol "(−)" is utilized in the lightly-doped region 76 to further indicate that region 74 is relatively heavily-doped as compared to the region 76.

A difficulty that may occur during the out-diffusion into channel material 44 is that the boundary region 72 may occur at different depths across a plurality of structures. Numerous mechanisms may influence the rate of out-diffusion into channel material 44, including, for example, crystal size and orientation, temperature, etc. An advantage of the processing of FIGS. 1-13 is that the gating structures 66 have gating regions 68 with large substantially vertical dimensions as compared to the thicknesses of the interconnect regions 70. FIG. 14 shows an example gating structure 66 having a gating region 68 with a large substantially vertical dimension D as compared to the thickness T of the interconnect region 70. In other words, the interconnecting region 70 is narrower than the gating region 68. The dimension D may be considered to be a length of the gating region. In the illustrated embodiments, the narrow interconnecting regions 70 are approximately centered relative to the wide gating regions 68. In other embodiments, the interconnecting regions may be off-center relative to the gating regions.

Figure 14A:
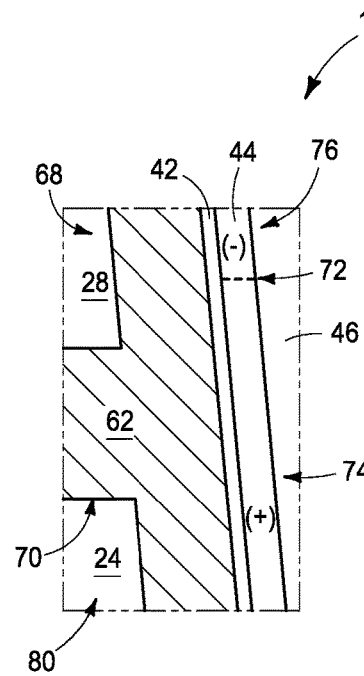
FIGS. 14A and 14B illustrate arrangements alternative to that of FIG. 14.
Figure 14B:
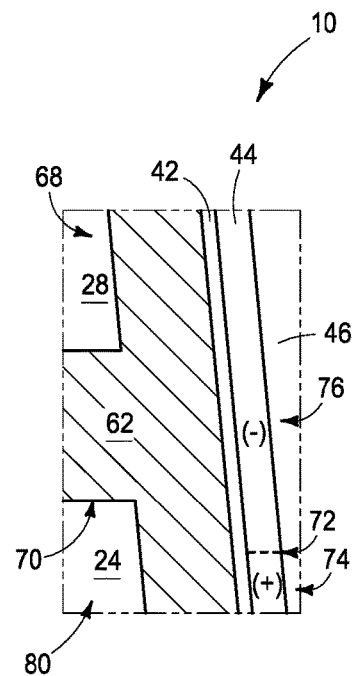

The large vertical dimension D may enable the gating region 68 to overlap both the lightly-doped region 76 and the heavily-doped region 74 of channel material 44 in spite of the potential variation of the location of the boundary region 72. For instance, FIGS. 14A and 14B illustrate alternative locations of the boundary region 72 as compared to FIG. 14, and show that the gating region 68 still maintains overlap with segments of both the heavily-doped region 74 and the lightly-doped region 76 in each instance.

The gating region 68 and channel material 44 together are comprised by a transistor device 80. Overlap with both the heavily-doped region 74 and the lightly-doped region 76 is desired in that each region provides an important characteristic relative to the transistor device 80. Specifically, overlap with the lightly-doped region 76 provides a non-leaky "OFF" characteristic for the transistor device, and overlap with the heavily-doped region provides leaky GIDL characteristics for the transistor device.

Figure 15:
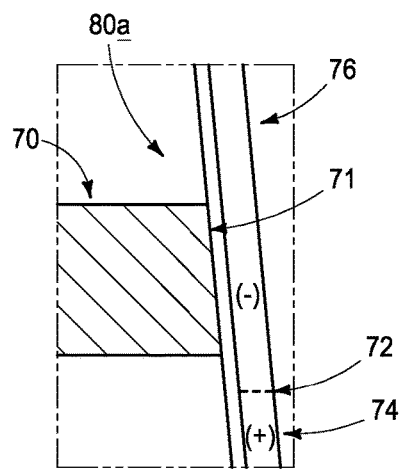
FIGS. 15 and 15A are views of structures alternative to those of FIGS. 14, 14A and 14B; and illustrate problematic arrangements that may result when utilizing the alternative structures.
Figure 15A:
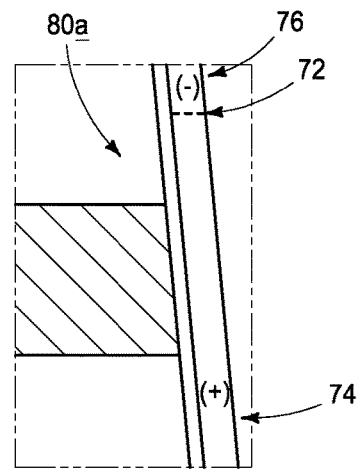

FIGS. 15 and 15A illustrate an alternative transistor device 80a illustrating a problem avoided utilizing the devices 80 of FIGS. 13 and 14. Specifically, the device 80a of FIGS. 15 and 15A only has the interconnect region 70, and lacks the substantially vertically-extending gating region 68. Thus, an edge 71 of interconnect region 70 functions as the gating region. Such edge is relatively narrow as compared to the gating region 68 of FIG. 14, and thus variation of the location of boundary region 72 causes the gating region to lose overlap relative to either the lightly-doped region 76 or the heavily-doped region 74. The device of FIG. 15 has overlap between a gating region and a lightly-doped region 76, but lacks overlap relative to the heavily-doped region 74. Accordingly, such device may have a non-leaky "OFF" characteristic, but lacks a desired leaky GIDL characteristic. In contrast, the device of FIG. 15A has overlap relative to heavily-doped region 74, and lacks overlap relative to lightly-doped region 76. Such device may have desired GIDL characteristics, but lacks a desired "OFF" characteristic.

In some embodiments, the transistors 80 of FIG. 13 may be utilized as select devices in memory arrays, such as, for example, three-dimensional NAND memory arrays.

Figure 16:
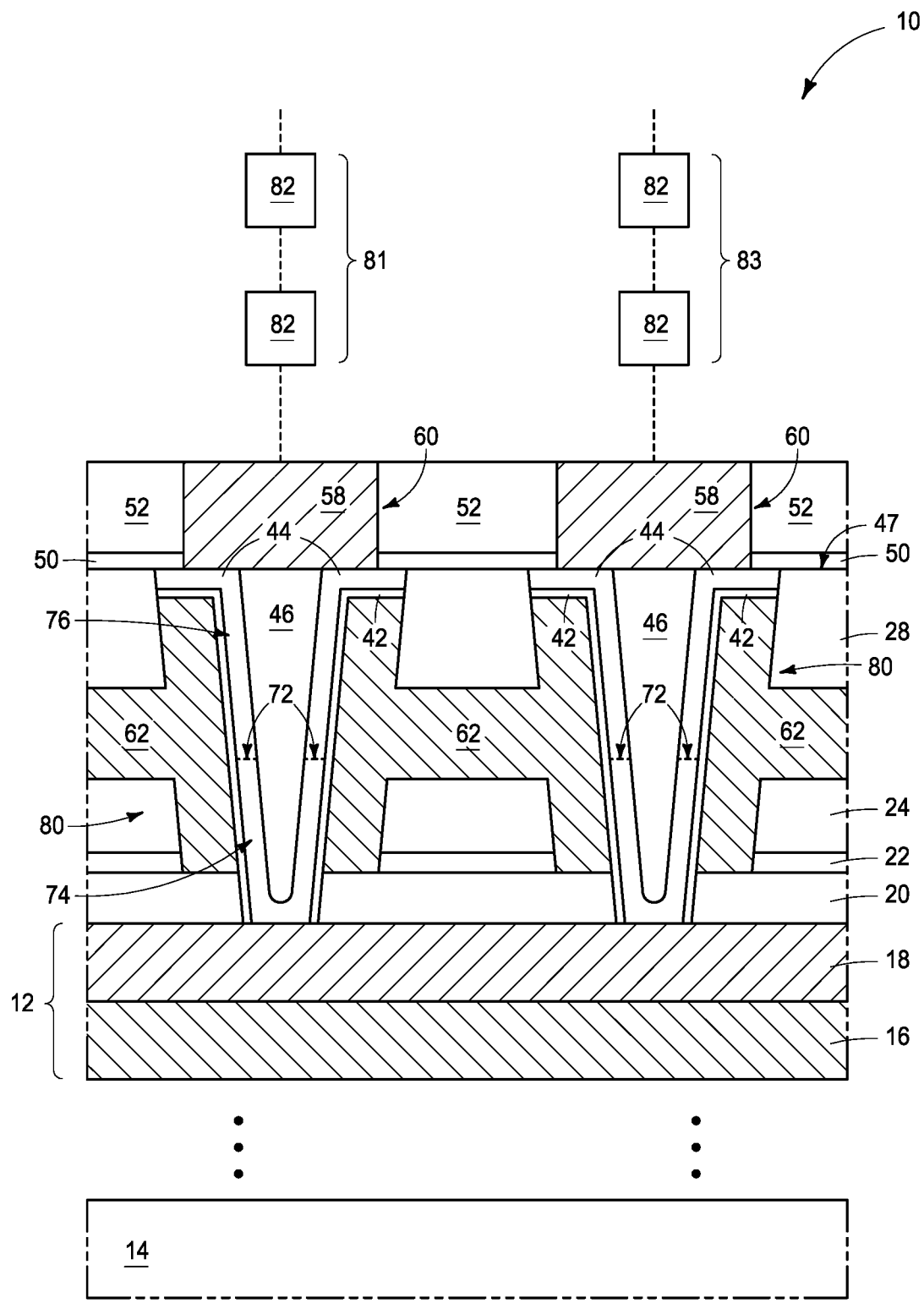
FIGS. 16 and 17 are diagrammatic cross-sectional views of the example embodiment gated structure of FIG. 13 incorporated into example embodiment integrated assemblies comprising memory.

FIG. 16 shows assembly 10 comprising columns 81 and 83 of vertically-stacked memory cells 82. The memory cells are electrically connected in series to channel material 44 of the select devices comprising transistors 80, and specifically are electrically connected to the channel material 44 through the conductive material 58 of plugs 60. The memory cells may be any suitable memory cells of a three-dimensional memory array.

Figure 17:
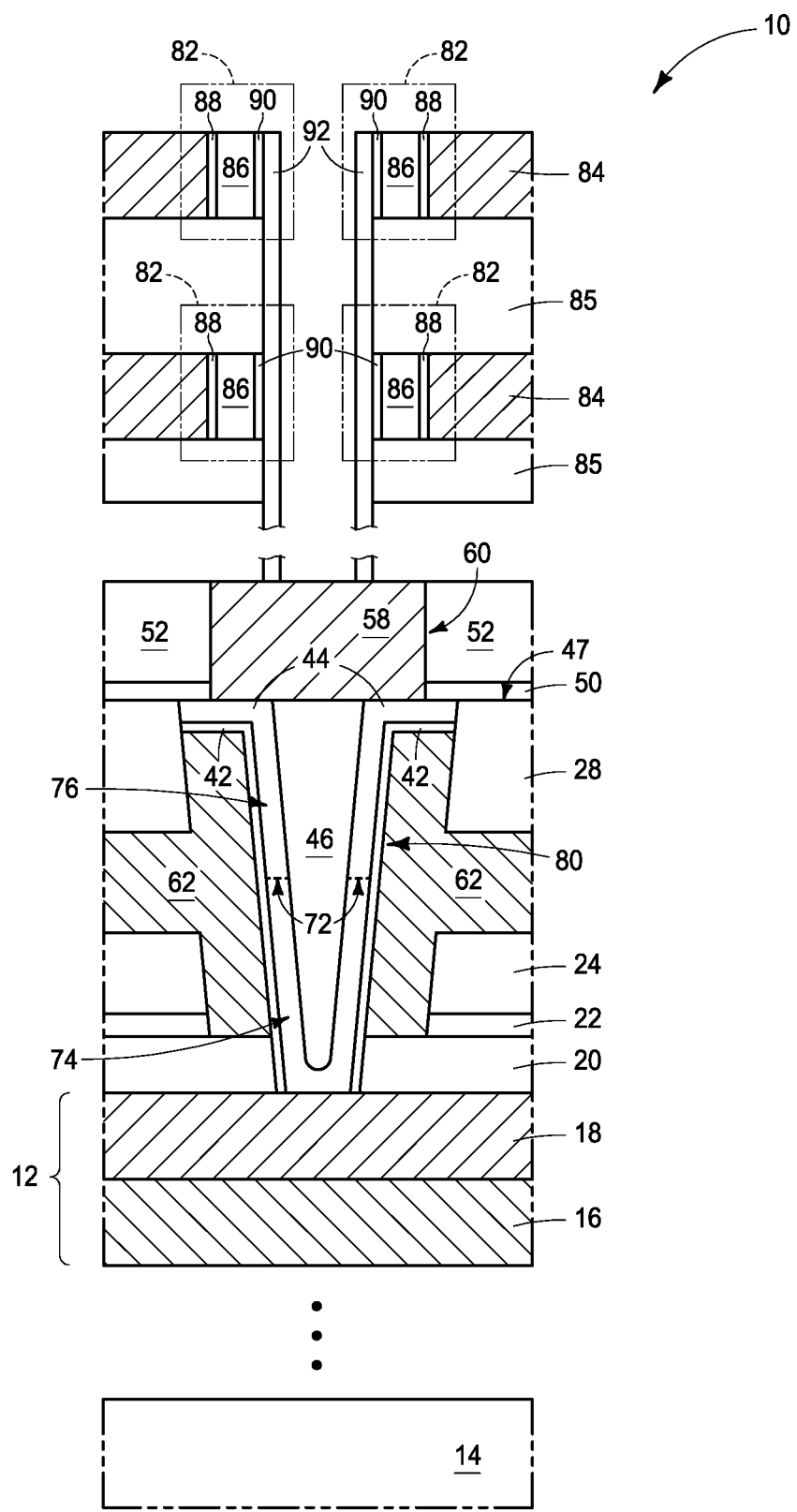

FIG. 17 shows a portion of assembly 10 in a configuration in which memory cells 82 specifically correspond to vertically-stacked memory cells of an example embodiment NAND memory array. The illustrated configuration comprises control gate material 84 alternating with insulating material 85; and comprises memory cells 82 which include charge-storage material 86, charge-blocking material 88, gate dielectric 90, and channel material 92.

The charge-storage material 86 may comprise any suitable composition or combination of compositions; and in some embodiments may comprise floating gate material (for instance, doped or undoped silicon) or charge-trapping material (for instance, silicon nitride, metal dots, etc.).

The charge-blocking material 88 may comprise any suitable composition or combination of compositions; and in some embodiments may comprise one or more of silicon dioxide, hafnium oxide, zirconium oxide, silicon nitride, etc.

The gate dielectric 90 may comprise any suitable composition or combination of compositions; and in some embodiments may comprise, for example, silicon dioxide.

The channel material 44 may be referred to as first channel material, and the channel material 92 may be referred to as second channel material (or vice versa). The first and second channel materials may be electrically coupled to one another through the conductive material 58 of plug 60. Accordingly, the memory cells 82 may be connected in series with a select device corresponding to transistor 80. In some embodiments, the conductive structure 12 may be a source line, and the select device may be a source-side select (SGS) device.

The gating devices and memory arrays described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated assembly which includes a semiconductor channel material having a boundary region where a more-heavily-doped region interfaces with a less-heavily-doped region. The more-heavily-doped region and the less-heavily-doped region are majority doped to have the same majority carriers. The integrated assembly includes a gating structure adjacent the semiconductor channel material and having a gating region and an interconnecting region of a common and continuous material. The gating region has a length extending along a segment of the more-heavily-doped region, a segment of the less-heavily-doped region, and the boundary region. The interconnecting region extends outwardly from the gating region on a side opposite the semiconductor channel region, and is narrower than the length of the gating region.

Some embodiments include an integrated assembly having vertically-stacked memory cells over a select device. First semiconductor channel material is along the memory cells. Second semiconductor channel material is comprised by the select device. The second semiconductor channel material comprises a boundary region where a more-heavily-doped region interfaces with a less-heavily-doped region. Both the more-heavily-doped region and the less-heavily-doped region are majority doped with a same dopant type. A gating structure is comprised by the select device. The gating structure is adjacent the second semiconductor channel material and has a gating region and an interconnecting region of a common and continuous material. The gating region has a length extending along a segment of the more-heavily-doped region, a segment of the less-heavily-doped region, and the boundary region. The interconnecting region extends outwardly from the gating region on a side opposite the second semiconductor channel region, and is narrower than the length of the gating region.

Some embodiments include a method of forming an integrated assembly. A stack is formed over heavily-doped semiconductor material. The stack comprises, in ascending order, a first tier, a second tier; a third tier; a first level of replaceable material; and a fourth tier. Openings are formed through the stack to the first tier. A second level of replaceable material is formed to line sidewalls and bottoms of the openings. The second level of replaceable material is anisotropically etched to form spacers along sidewalls of the openings and to expose bottom surfaces of the openings along the first tier. The spacers join with the first level of replaceable material to form replaceable material structures having stem regions extending horizontally outward from vertical trunk regions. The openings are extended to the heavily-doped semiconductor material. Gate dielectric is formed along sidewalls of the extended openings. Semiconductor channel material is formed along the gate dielectric. The semiconductor channel material is lightly doped as compared to the heavily-doped semiconductor material and is majority doped to a same dopant type as the heavily-doped semiconductor material. Dopant is out-diffused from the heavily-doped semiconductor material into the semiconductor channel material to form heavily-doped bottom regions of the semiconductor channel material while leaving less-heavily-doped upper regions of the semiconductor channel material. The replaceable material is replaced with conductive material to form gating structures. The trunk regions of the replaceable material structures become gating regions of the gating structures, and the stem regions of the replaceable material structures become interconnecting regions of the gating structures. The gating regions of the gating structures are adjacent segments of the heavily-doped bottom regions of the semiconductor channel material and are also adjacent segments of the lightly-doped upper regions of the semiconductor channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming a substantially vertically extending semiconductor channel structure;
    doping the first semiconductor channel structure to form a channel region having a more-heavily-doped region interfacing a less-heavily-doped region at a boundary region; and
    forming a gating structure adjacent the semiconductor channel structure and having a gating region and an interconnecting region of a common and continuous material, the gating region having a length extending across a segment of the more-heavily-doped region, a segment of the less-heavily-doped region, and the boundary region, the interconnecting region extending laterally outwardly from the gating region on a side opposite the first semiconductor channel material, and being narrower than the length of the gating region.

2. The method of claim 1 wherein the more-heavily doped region and the less-heavily doped region are majority doped to have the same majority carriers.

3. The method of claim 1 wherein the interconnecting region of the gating structure is approximately centered relative to the length of the gating region.

4. The integrated assembly of claim 1 wherein the interconnecting region and the gating region are about the same thickness as one another.

5. The integrated assembly of claim 1 wherein the interconnecting region is thicker than the gating region.

6. A method of forming an integrated assembly, comprising:
    forming a stack over heavily-doped semiconductor material; the stack comprising a first level of replaceable material over a first tier and second tier;
    forming openings through the stack to the first tier;
    forming spacers along sidewalls of the openings, the spacers joining with the first level of replaceable material to form replaceable material structures having stem regions extending horizontally outward from substantially vertical trunk regions;
    extending the openings to the heavily-doped semiconductor material;
    forming gate dielectric along sidewalls of the extended openings;
    forming a semiconductor channel material along the gate dielectric; the semiconductor channel material being lightly doped as compared to the heavily-doped semiconductor material and being majority doped to a same dopant type as the heavily-doped semiconductor material;

out-diffusing dopant from the heavily-doped semiconductor material into the semiconductor channel material to form heavily-doped bottom regions of the semiconductor channel material while leaving less-heavily-doped upper regions of the semiconductor channel material; and replacing the replaceable material structures with a conductive material to form gating structures, the trunk regions of the replaceable material structures becoming gating regions of the gating structures, and the stem regions of the replaceable material structures becoming interconnecting regions of the gating structures.

7. The method of claim 6 wherein the second tier comprises a high-k oxide.

8. The method of claim 6 wherein the stack further comprises a third tier disposed between the second tier and the first level of replaceable material.

9. The method of claim 6 wherein the gating structures form a plurality of select gates of select devices, and further comprising forming memory cells electrically connected in series with the select devices.

10. The method of claim 6 wherein the replaceable material is silicon nitride.

11. The method of claim 6 wherein conductive material comprises metal.

* * * * *